United States Patent
Kim et al.

(10) Patent No.: US 12,411,410 B2
(45) Date of Patent: Sep. 9, 2025

(54) ULTRATHIN FILM SHADOW MASK FOR LITHOGRAPHY AND LITHOGRAPHY METHOD USING THE SAME

(71) Applicant: POSTECH RESEARCH AND BUSINESS DEVELOPMENT FOUNDATION, Pohang-si (KR)

(72) Inventors: Seok Kim, Pohang-si (KR); Sangyeop Lee, Pohang-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 61 days.

(21) Appl. No.: 18/544,920

(22) Filed: Dec. 19, 2023

(65) Prior Publication Data
US 2025/0044698 A1    Feb. 6, 2025

(30) Foreign Application Priority Data

Aug. 4, 2023   (KR) ................. 10-2023-0102200

(51) Int. Cl.
G03F 7/12 (2006.01)
B41N 1/24 (2006.01)
G03F 7/00 (2006.01)

(52) U.S. Cl.
CPC .............. *G03F 7/12* (2013.01); *B41N 1/248* (2013.01); *G03F 7/0002* (2013.01); *G03F 7/0035* (2013.01)

(58) Field of Classification Search
CPC ......... B41N 1/248; G03F 7/12; G03F 7/0002; G03F 7/0035
See application file for complete search history.

(56) References Cited

U.S. PATENT DOCUMENTS

| 2009/0022896 A1* | 1/2009 | Merkel | G03F 7/0015 |
| | | | 427/331 |
| 2010/0021577 A1* | 1/2010 | Stewart | B82Y 40/00 |
| | | | 264/293 |
| 2013/0036928 A1* | 2/2013 | Rogers | B41J 2/475 |
| | | | 101/483 |
| 2016/0016399 A1* | 1/2016 | Bower | B25J 15/00 |
| | | | 101/287 |

(Continued)

FOREIGN PATENT DOCUMENTS

| KR | 10-2010-0136479 | 12/2010 |
| KR | 10-2012-0032208 | 4/2012 |
| KR | 10-2012-0138263 | 12/2012 |

OTHER PUBLICATIONS

KIPO, Office Action of KR 10-2023-0102200 dated Oct. 28, 2024.

*Primary Examiner* — David H Banh
(74) *Attorney, Agent, or Firm* — LEX IP MEISTER, PLLC

(57) ABSTRACT

Provided are a new ultrathin film silicon shadow mask which is flexible, is reusable, and can be precisely aligned and manipulated through transfer printing, and a lithography method using the same. A thin thickness of a silicon shadow mask may intrinsically form a pattern having an enhanced resolution in a plane and a non-planar surface. Further, the silicon shadow mask may be formed on a substrate by metal deposition in addition to etching in a multi-layer configuration by a transfer printing technology based alignment method. Through such a method, a material in which patterning is impossible may be patterned through photolithography.

7 Claims, 17 Drawing Sheets

(56) References Cited

U.S. PATENT DOCUMENTS

2018/0120696 A1\* 5/2018 Auzelyte .............. G03F 7/0002
2019/0056463 A1\* 2/2019 Novosad ............ A61K 49/1818
2020/0033740 A1\* 1/2020 Wu .................. H01L 21/02082
2020/0223999 A1\* 7/2020 Malic ..................... G03F 7/031

\* cited by examiner

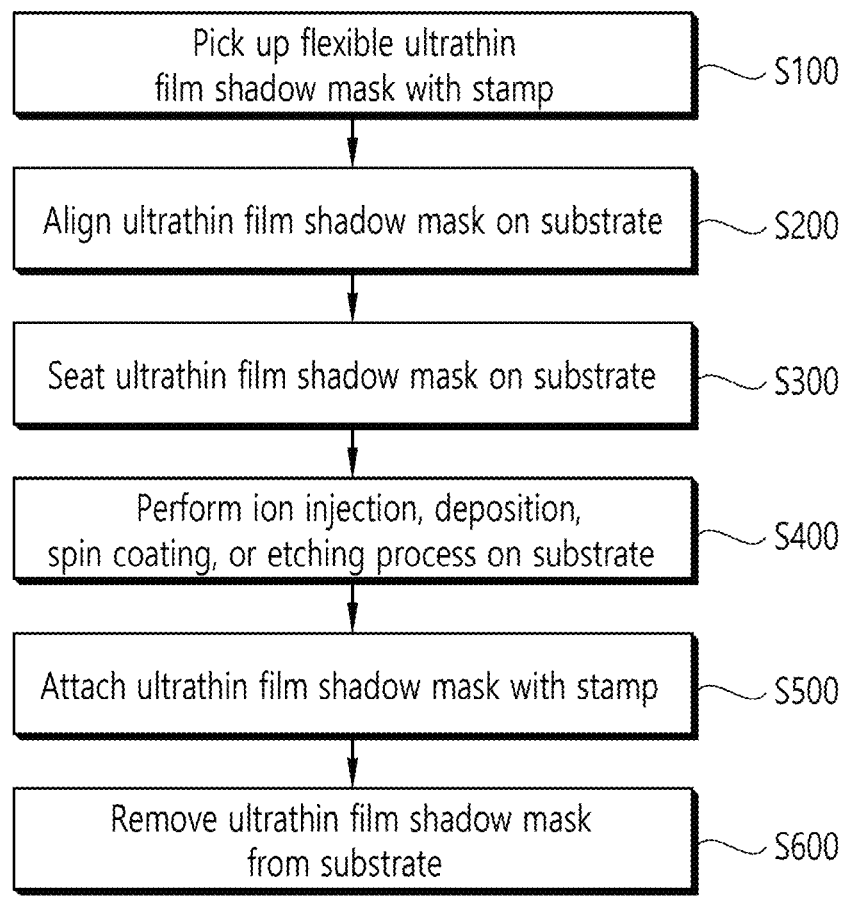

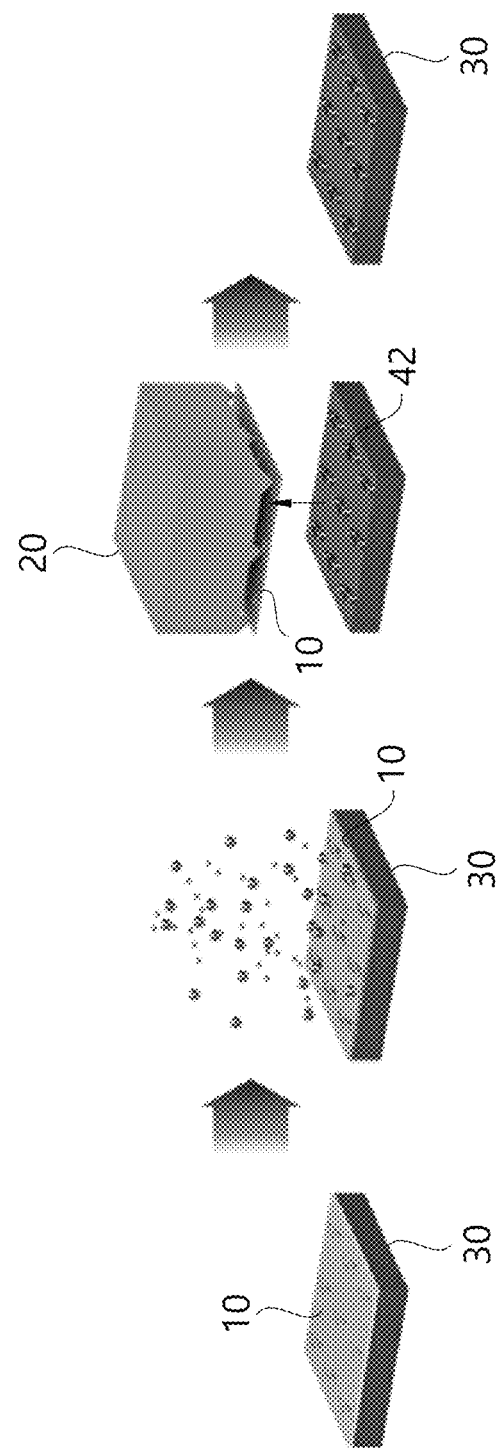

ULTRATHIN FILM SHADOW MASK FOR LITHOGRAPHY AND LITHOGRAPHY METHOD USING THE SAME

CROSS REFERENCE TO RELATED APPLICATION

This application claims priority from Republic of Korea Patent Application No. 10-2023-0102200, filed on Aug. 4, 2023, which is hereby incorporated by reference in its entirety.

BACKGROUND

Field

The present disclosure relates to an ultrathin film shadow mask which is configured by an ultrathin film, is flexible, and is reusable, and a lithography method using the same.

Related Art

Stencil lithography is a versatile micro/nano patterning technique that usually uses a shadow mask with a patterned hole to selectively deposit a material on a substrate. The stencil lithography provides patterning possibilities of a wide range of materials because the stencil lithography does not require conventional photolithography that can limit selection of patterned materials. Because of such unique characteristics, the stencil lithography is a method preferred in manufacturing a variety of devices including an organic light emitting diode (OLED), an organic thin film transistor (OTFT), a 2D transistor, and cell patterning. Considering the diversity and simplicity, the stencil lithography has emerged as a promising alternative to the existing lithography patterning technology, allowing researchers to deposit new materials and pattern the materials for additional applications.

In order to expand a potential application range of the stencil lithography, it is necessary to increase pattern precision. The larger an interval between the mask and the substrate, the more bluing effects are generated, and the thicker mask creates more shadow effects during the pattern formation, and both of these reduce the patterning precision of the stencil lithography. Therefore, by making the mask and the substrate contact each other, and thinning a thickness of the mask, it is necessary to increase the precision of the pattern.

In addition, if patterning is possible on a curved surface in addition to a plane, process scalability of the stencil lithography can be expanded. In order to perform the stencil lithography on the curved surface, it should be able to fully contact a curve shape. While organic material-based shadow masks have been studied for this purpose, an organic material shadow mask is generally limited in reuse because the organic material shadow mask is less chemical resistance than a silicon-based shadow mask. In addition, due to excessive flexible characteristics, there is a difficulty in handling. Therefore, in order to develop stencil lithography technology, a flexible shadow mask is required, which is mechanically and chemically strong, and enables high-resolution patterning.

Another problem is that there is no formal technology that accurately aligns the shadow mask. In previous studies, there is a method of aligning the shadow mask by producing a polymer jig, a built-in cavity, a substrate V groove, and a SU-8 filler. However, these methods reduce the scalability of stencil lithography processes because the methods require additional structures on the substrate and limit the selection of substrate materials. To overcome these problems, a new method for manipulating a thin shadow mask for high precision alignment is required.

SUMMARY

The present disclosure provides an ultrathin film shadow mask which has a high resolution, has a stable alignment scheme, and is reusable in conventional lithography technology, and a lithography method using the same.

In an aspect, an ultrathin film shadow mask for lithography, which is made of a rigid material and configured as an ultrathin film type to have a flexible behavior may be provided, which includes a pattern part in which a lithography pattern is formed, in which one surface of the pattern part is an attachment surface configured to be attached to a stamp, and an opposite surface of the pattern part is a close contact surface configured to be in close contact with a substrate.

Meanwhile, the ultrathin film shadow mask for lithography may be made of a silicon.

Meanwhile, the ultrathin film shadow mask for lithography may be configured as a freestanding type which is in close contact with and fixed to the substrate.

Meanwhile, the ultrathin film shadow mask for lithography may be configured to be transferred or transported as the attachment surface is attached by a polymer based stamp.

Further, when contaminants are deposited on the pattern part by repeated use, the contaminants may be removed by an etching solution, and the ultrathin film shadow mask for lithography may be configured to be reusable.

Meanwhile, when at least a part of an outer surface of the substrate is formed by a curved surface, the close contact surface may be configured to be in close contact with the substrate along the curved surface.

Meanwhile, the ultrathin film shadow mask may be manufactured through a step of preparing a silicon-on-insulator (SOI) wafer having a thickness of several μm to dozens of μm, a photoresistor coating step of applying a photoresistor onto the top of the SOI wafer, a patterning step of irradiating a predetermined pattern of light to a region to which the photoresistor is applied, a deep reactive ion etching (DRIE) step of forming a pattern part in an SOI substrate after the patterning step, and a fluoride hydrogen etching to remove a buried oxide (BOX) layer of the SOI wafer.

In another aspect, a lithograph method using an ultrathin film shadow mask may be provided, which includes: picking up a flexible ultrathin film shadow mask with a stamp; aligning the ultrathin film shadow mask on a substrate; seating the ultrathin film shadow mask on the substrate; separating the stamp from the ultrathin film shadow mask; performing an ion injection, deposition, spin coating, or etching process on the substrate; attaching the ultrathin film shadow mask with the stamp; and removing the ultrathin film shadow mask from the substrate.

In this case, a thickness of the ultrathin film shadow mask may be several μm to dozens of μm, and when the substrate is bent, the ultrathin film shadow mask may be seated in a state of being bent along the substrate.

Meanwhile, the ultrathin film shadow mask may be made of a silicon.

Meanwhile, in the seating, the ultrathin film shadow mask may be fixed to the substrate as a freestanding type.

Further, the picking up may be configured to pick up the ultrathin film shadow mask by attaching the top of the ultrathin film shadow mask with the stamp.

Meanwhile, multi-layer patterns may be enabled to be formed in the substrate by performing, after the removing of the ultrathin film shadow mask from the substrate, picking up a second ultrathin film shadow mask having a different pattern from the ultrathin film shadow mask with the stamp, aligning the second ultrathin film shadow mask on the substrate, seating the second ultrathin film shadow mask on the substrate, separating the stamp from the second ultrathin film shadow mask, performing an ion injection, deposition, spin coating, or etching process on the substrate, attaching the second ultrathin film shadow mask with the stamp, and removing the second ultrathin film shadow mask from the substrate.

Meanwhile, the lithography method may further include cleaning the ultrathin film shadow mask removed from the substrate by soaking the ultrathin film shadow mask in an etching solution.

In an ultrathin film shadow mask, and a lithography method using the same according to the present disclosure, it is possible to form a pattern having high precision and resolution in a plane and a curved surface.

Further, there is an effect of reducing production cost in a semiconductor process based on high reusability.

BRIEF DESCRIPTION OF THE DRAWINGS

FIG. 4 is a flowchart of a lithography method according to a second exemplary embodiment of the present disclosure.

FIG. 6c is a conceptual view of a deposition process in the second exemplary embodiment of the present disclosure.

DESCRIPTION OF EXEMPLARY EMBODIMENTS

Figure 1:
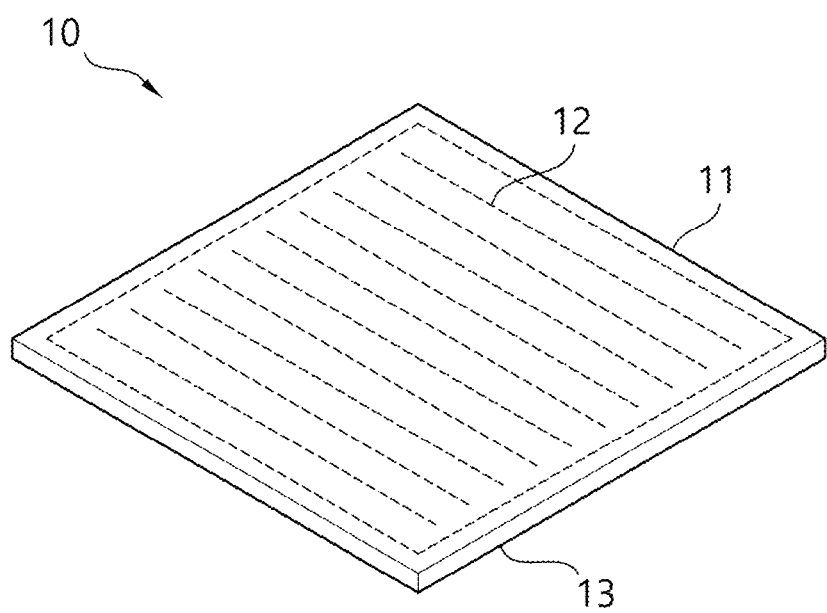
FIG. 1 is a perspective view of an ultrathin film shadow mask according to a first exemplary embodiment of the present disclosure.

Hereinafter, an ultrathin film shadow mask for lithography and a lithography method using the same will be described in detail with reference to the accompanying drawings. In addition, in the description of the following exemplary embodiment, names of respective components may be called other names in the art. However, if the components are functionally similar to or are the same as each other, the components may be regarded as an equivalent component even though a modified exemplary embodiment is adopted. Further, reference numerals assigned to the respective components are disclosed for convenience of description. However, illustrated contents in the drawing in which the reference numerals are disclosed do not limit the respective components to a range in the drawing. Similarly, even though an exemplary embodiment is adopted in which some components in the drawing are modified, if the components are functionally similar to and the same as each other, the components may be regarded as an equivalent component. In addition, in light of the general technician level of the technical field, the description is omitted if the component is recognized as a component to be particularly included.

Hereinafter, in the present disclosure, an ultrathin film means a mask having a thickness of several μm to dozens of μm, and may include a thin film according to interpretation. However, for the convenience of description, a mask having a thin thickness will be below called an ultrathin film shadow mask, and described.

FIG. 1 is a perspective view of an ultrathin film shadow mask according to a first exemplary embodiment of the present disclosure.

Referring to FIG. 1, an ultrathin film shadow mask 10 according to a first exemplary embodiment of the present disclosure has a flexible feature, and is configured to be precisely aligned and manipulated through transfer printing.

The ultrathin film shadow mask 10 is configured as a flat plate type without external force. A pattern part 12 in which a lithography pattern 40 is formed is provided at a central portion. One surface of the ultrathin film shadow mask 10 may become an attachment surface 11 attached by a stamp 20 to be described below, and an opposite surface may become a close contact surface 13 which is in close contact with a substrate 30.

In the present disclosure, the ultrathin film shadow mask 10 is configured to be transfer-printed as the attachment surface 11 is attached to the stamp 20. Therefore, a holding structure provided for separate transfer in a general mask may be omitted. In FIG. 1, most of regions of the shadow mask 10 are distinguished by the pattern part 12, but a holding region for an external picker to pick up the mask is not required, so all regions of the shadow mask 10 may be possible to serve as the pattern part 12. Further, the conventional mask has a limit in that the pattern part 12 is not in close contact with a curved substrate by the holding structure, so a blurring effect is generated. However, in the present disclosure, a mask having no holding structure and having a flexible feature may be in close contact with the substrate 30, so generation of blurring may be prevented, and a resolution may be increased.

Meanwhile, the stamp 20 used for transfer of the ultrathin film shadow mask 10 according to the present disclosure as a polymer based stamp 20 may adopt an elastomer stamp using dry adhesive force in which transfer receivability for various materials such as a semiconductor, metal a polymer material, etc., is wide, and foreign substances are not left after transfer, and a process is cleanly conducted. As an example, as an example of the elastomer stamp 20, a stamp 20 made of polydimethylsiloxane (PDMS) may be used. The PDMS stamp 20 bonds the shadow mask 10 to the surface of the stamp 20 to enable transmission to a receiving substrate 30 at a high speed. PDMS adhesive force control is required for a smooth transfer process, and this is constituted by a speed, temperature control, UV irradiation, etc., of the transfer process.

The shadow mask 10 may be made of a silicon based rigid material. When the shadow mask 10 is configured based on a silicon, chemical resistance is higher than that when the shadow mask 10 is configured based on an organic material, so reusability may be remarkably increased. Meanwhile, reuse will be described later.

The shadow mask 10 is configured by an ultrathin film, and as an example, a thickness of the shadow mask 10 may be several μm to dozens of μm. Accordingly, the shadow mask 10 may have a flexible feature, and may be in close contact with a curved substrate 30 in addition to a planar substrate 30. That is, a correspondence of the ultrathin film shadow mask 10 to a shape of the substrate 30 may be maximized, and the ultrathin film shadow mask 10 is in close contact with the substrate 30 to obtain a freestanding fixation feature.

Hereinafter, referring to FIG. 2, a manufacturing method of the ultrathin film shadow mask 10 which is the first exemplary embodiment of the present disclosure will be described.

Figure 2:
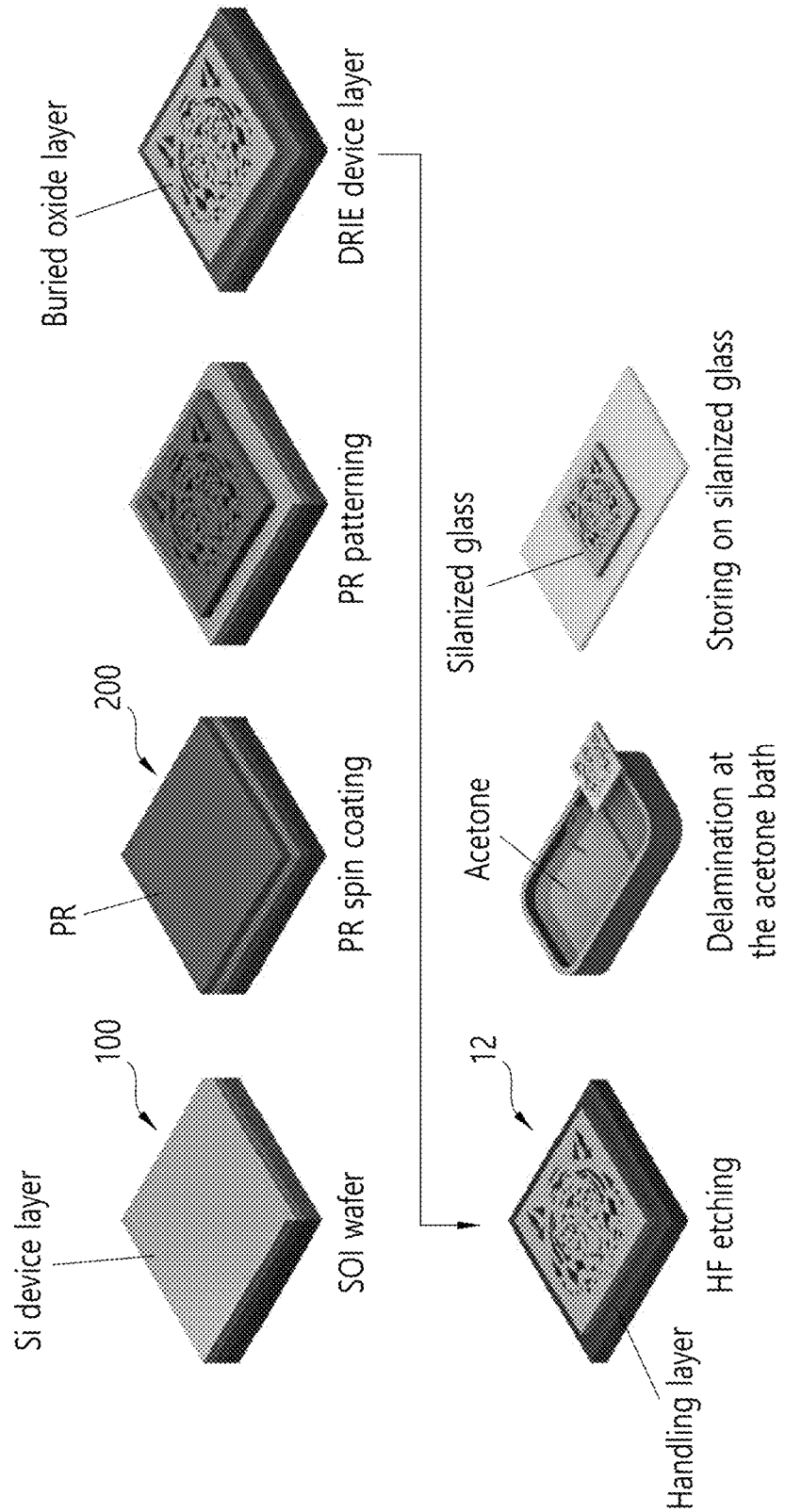
FIG. 2 is a conceptual view illustrating a manufacturing process of the ultrathin film shadow mask in the present disclosure.

FIG. 2 is a conceptual view illustrating a manufacturing process of the ultrathin film shadow mask 10 in the present disclosure.

Figure 3:
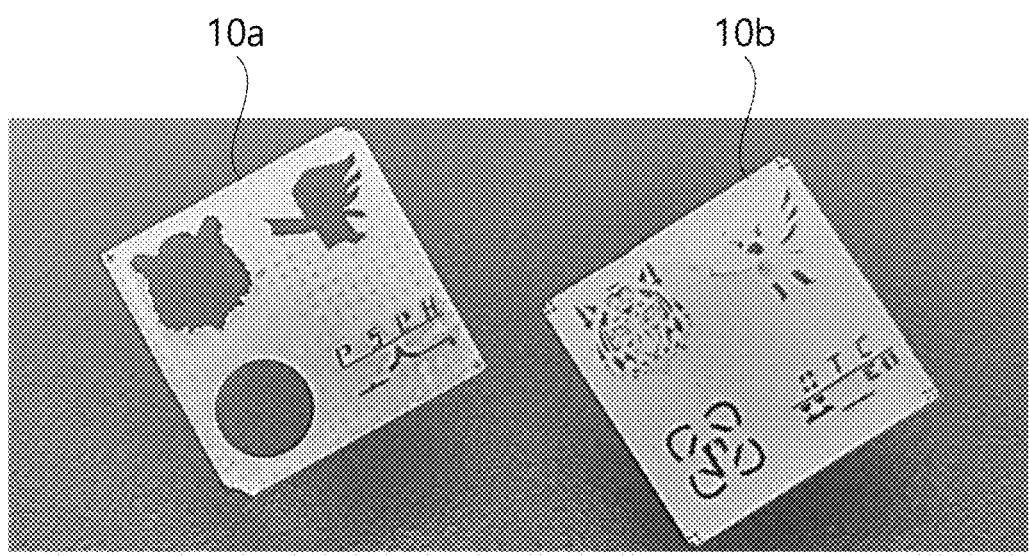
FIG. 3 is a diagram illustrating an example of the ultrathin film shadow mask in the present disclosure.

Referring to FIG. 3, the ultrathin film shadow mask 10 may be manufactured through a step of preparing a silicon-on-insulator (SOI) wafer having a thickness of several μm to dozens of μm, a photoresistor coating step of applying a photoresistor onto the top of the SOI wafer, a patterning step of irradiating a predetermined pattern of light to a region to which the photoresistor is applied, a deep reactive ion etching (DRIE) step of forming a pattern part 12 in an SOI substrate 30 after the patterning step, and a fluoride hydrogen etching step to remove a buried oxide (BOX) layer of the SOI wafer.

The thickness of the shadow mask 10 may be determined as a thickness of a silicon active layer of the SOI wafer. The manufactured shadow mask 10 may be kept in a intermediate substrate 30 having low adhesive force to be easily used later.

FIG. 3 is a diagram illustrating an example of the ultrathin film shadow mask in the present disclosure.

Referring to FIG. 3, in the present disclosure, in the ultrathin film shadow mask 10, a desired pattern may be formed in the pattern part 12 through the steps described in FIG. 2, and the ultrathin film shadow mask 10 may be manufactured in a state in which a separate structure for handling is omitted. Further, a first ultrathin film shadow mask 10a and a second ultrathin film shadow mask 10b may have different patterns, and may be jointly used for the multi-layer process.

Hereinafter, a lithography method using the ultrathin film shadow mask 10 which is a second exemplary embodiment of the present disclosure will be described with reference to FIGS. 4 to 9. Hereinafter, in the second exemplary embodiment, an ion injection, deposition, or etching process may be performed by using the ultrathin film shadow mask 10 which is the first exemplary embodiment.

Figure 5A:
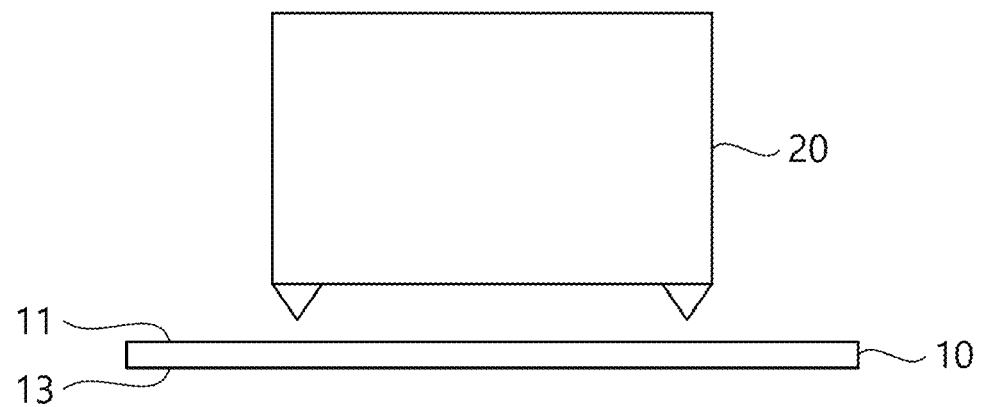
FIGS. 5a, 5b, and 5c are diagrams illustrating a concept of picking up an ultrathin film shadow mask using a stamp.
Figure 5B:
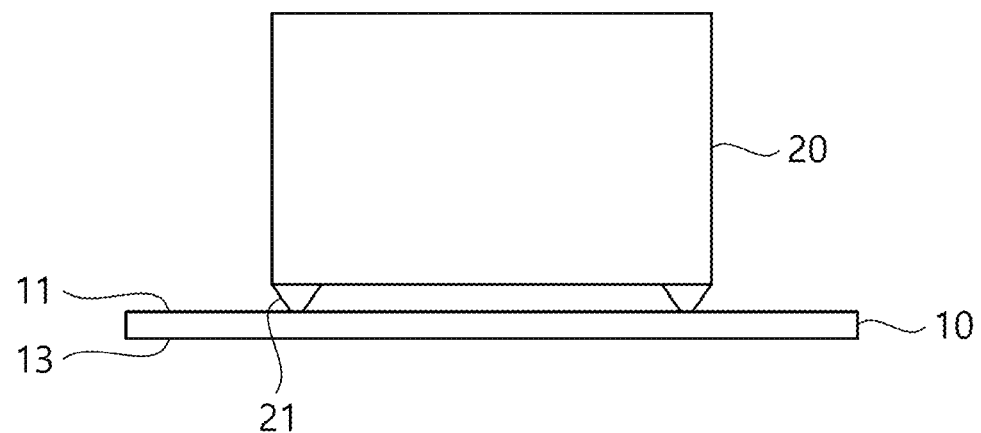
Figure 5C:
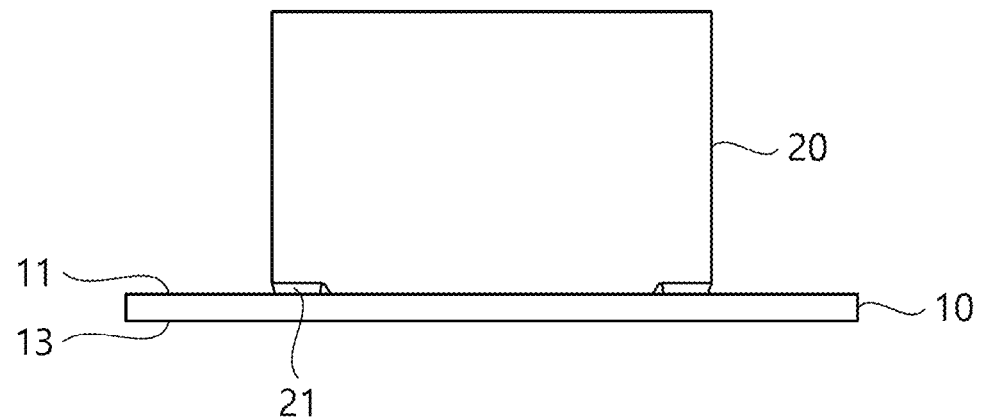
Figure 6A:
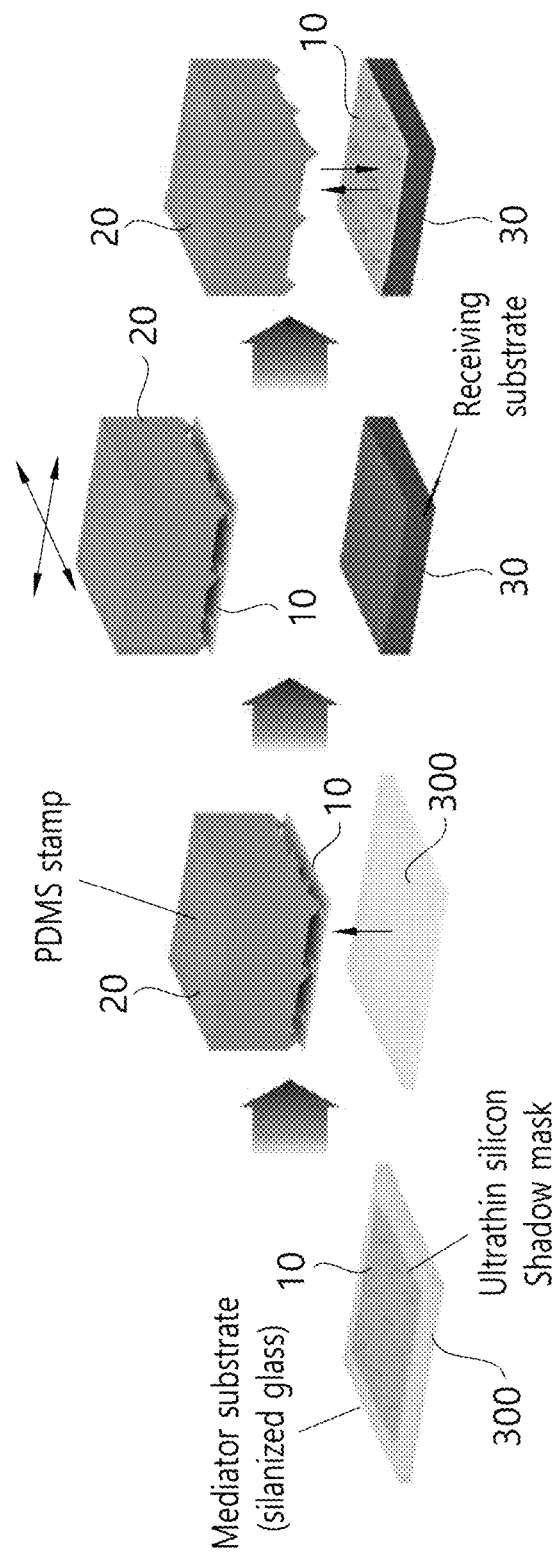
FIG. 6a is a conceptual view of a transfer process in the second exemplary embodiment of the present disclosure.
Figure 6B:
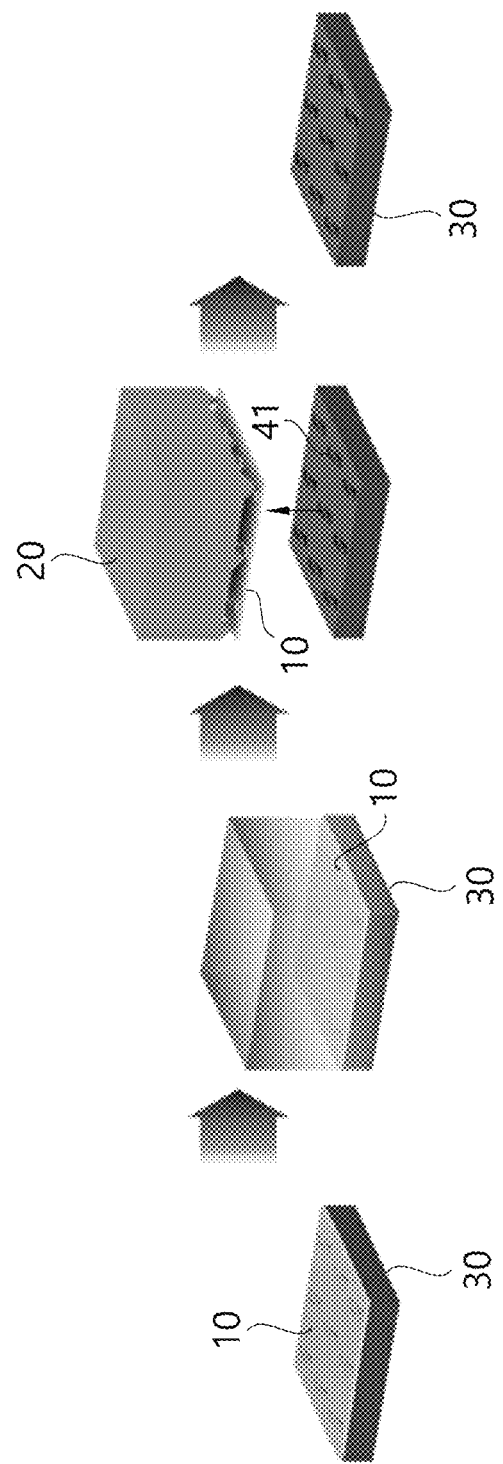
FIG. 6b is a conceptual view of an etching process in the second exemplary embodiment of the present disclosure.

FIG. 4 is a flowchart of a lithography method according to a second exemplary embodiment of the present disclosure, and FIGS. 5a, 5b, and 5c are diagrams illustrating a concept of picking up an ultrathin film shadow mask 10 using a stamp 20. Further, FIG. 6a is a conceptual view of a transfer process in the second exemplary embodiment of the present disclosure, FIG. 6b is a conceptual view of an etching process in the second exemplary embodiment of the present disclosure, and FIG. 6c is a conceptual view of a deposition process in the second exemplary embodiment of the present disclosure.

Referring to FIG. 4, the second exemplary embodiment according to the present disclosure may include a step S100 of picking up a flexible ultrathin film shadow mask with a stamp 20, a step S200 of aligning the ultrathin film shadow mask on a substrate, a step S300 of seating the ultrathin film shadow mask on the substrate, a step S400 of separating the stamp 20 from the ultrathin film shadow mask, a step S500 of performing an ion injection, deposition, or etching process on the substrate, a step S600 of attaching the ultrathin film shadow mask with the stamp, and a step S700 of removing the ultrathin film shadow mask from the substrate.

Step S100 of picking up the flexible thin-film shadow mask 10 with the stamp 20 corresponds to a step of picking up the ultrathin film shadow mask 10 kept in an intermediate substrate 30 with the stamp 20. In this step, the stamp 20 attaches an attachment surface 11 of the ultrathin film shadow mask 10 by a dry bonding scheme. In regard to this step, referring to FIGS. 5a and 5b, a concept of attaching the ultrathin film shadow mask 10 using the stamp 20 is illustrated. As illustrated in FIG. 5a, the stamp 20 may be aligned at an upper side of the shadow mask 10, as illustrated in FIG. 5b, when the stamp 20 moves down, a tip 21 of the stamp 20 is transformed, or as illustrated in FIG. 5c, while the tip 21 is squashed, the stamp 20 may dry-bond the attachment surface 11 of the substrate 10.

Step S200 of aligning the ultrathin film shadow mask 10 on the substrate 30 corresponds to a step of aligning a location of the stamp 20 and a horizontal location of the substrate 30. In this step, alignment may be performed by using an alignment scheme which is used in the related art, such as an alignment marker, etc.

Step S300 of seating the ultrathin film shadow mask 10 on the substrate 30 corresponds to a step of seating the ultrathin film shadow mask 10 on the substrate 30 by moving down the stamp 20 in a state of aligning the horizontal location of the ultrathin film shadow mask 10.

Step S400 of separating the stamp 20 from the ultrathin film shadow mask 10 corresponds to a step of making the ultrathin film shadow mask 10 be in close contact with the substrate 30 by controlling the adhesive force of the stamp 20 to be reduced. As described above, the bottom of the ultrathin film shadow mask 10 serves as a close contact surface 13 which is in close contact with the substrate 30, and a location of the ultrathin film shadow mask 10 may be fixed as a freestanding type even though the stamp 20 is removed. In regard to the above-described steps S100 to S400, FIG. 6a schematically illustrates the transfer process of the ultrathin film shadow mask 10.

Step S500 of performing the ion injection, deposition, or etching process on the substrate 30 corresponds to a process of performing any one step of processes required for the substrate 300. A process for forming a positive pattern 42 such as ion injection or deposition in the state in which the ultrathin film shadow mask 10 is in close contact with the substrate 30 may be performed. In this regard, FIG. 6c illustrates a concept of the process for forming the positive pattern 42. Meanwhile, an etching process for forming a negative pattern 41 in the state in which the ultrathin film shadow mask 10 is in close contact with the substrate 30 may be performed. In this regard, FIG. 6b illustrates a concept of the process for forming the negative pattern 41. However, although not illustrated, when spin coating is performed by using the shadow mask according to the present disclosure, the spin coating may be performed by applying a solution onto the top of the shadow mask 10, and rotating the substrate 30 and the ultrathin film shadow mask 10 simultaneously. In the case of the spin coating, the solution is dispersed along the top of the ultrathin film shadow mask 10 when the ultrathin film shadow mask 10 is rotated, and the pattern may be formed according to the pattern part. Further, as described below, since the stamp 20 picks up the ultrathin film shadow mask 10 onto the top of the ultrathin film shadow mask 10, a process in which the solution is not left on the top of the ultrathin film shadow mask 10 may be additionally conducted upon the spin coating, or a process of removing the solution which is left from the top of the ultrathin film shadow mask 10 may be added after the spin coating is terminated.

Step S600 of attaching the ultrathin film shadow mask 10 with the stamp 20 corresponds to a step of attaching the shadow mask 10 with the stamp 20 in order to remove the ultrathin film shadow mask 10 when the use of the ultrathin film shadow mask 10 is terminated in the process. This step may be performed substantially similarly to step S100 of picking up the flexible ultrathin film shadow mask 10 with the stamp 20.

Step S700 of removing the ultrathin film shadow mask 10 from the substrate 30 corresponds to a step of removing the ultrathin film shadow mask 10 from a process space by controlling the location of the stamp 20.

The steps of the second exemplary embodiments are used, and the ultrathin film shadow masks 10 having various patterns are used to form multi-layer and various lithography patterns 40.

Meanwhile, the above-described steps S100 to S600 may be continuously performed in one substrate 30 by exchanging the shadow mask 10. That is, a multi-layer process may be performed by using the shadow masks 10 having different patterns.

Figure 7:
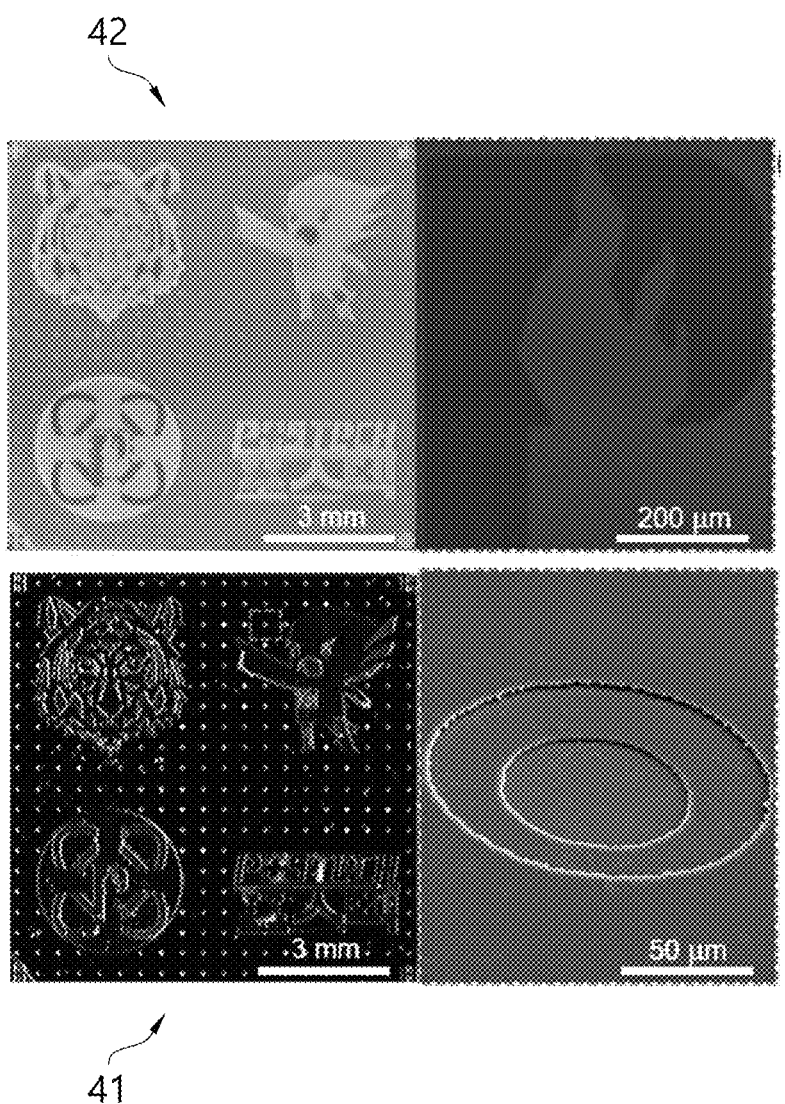
FIG. 7 is a diagram illustrating a multi-layer pattern generated according to the second exemplary embodiment of the present disclosure.

FIG. 7 is a diagram illustrating a multi-layer pattern generated according to the second exemplary embodiment of the present disclosure. Referring to FIG. 7, an example in which the lithography pattern is formed by using the first ultrathin film shadow mask 10a and the second ultrathin film shadow mask 10b illustrated in FIG. 3 is illustrated. At an upper side of FIG. 7, an SEM image (left) and a partial enlarged image (right) when a positive lithography pattern 42 is formed by using a metal deposition process may be confirmed. Further, at a lower side of FIG. 7, an SEM image (left) and a partial enlarged image (right) when a negative lithography pattern 41 is formed by using a dry etching process may be confirmed.

Figure 8A:
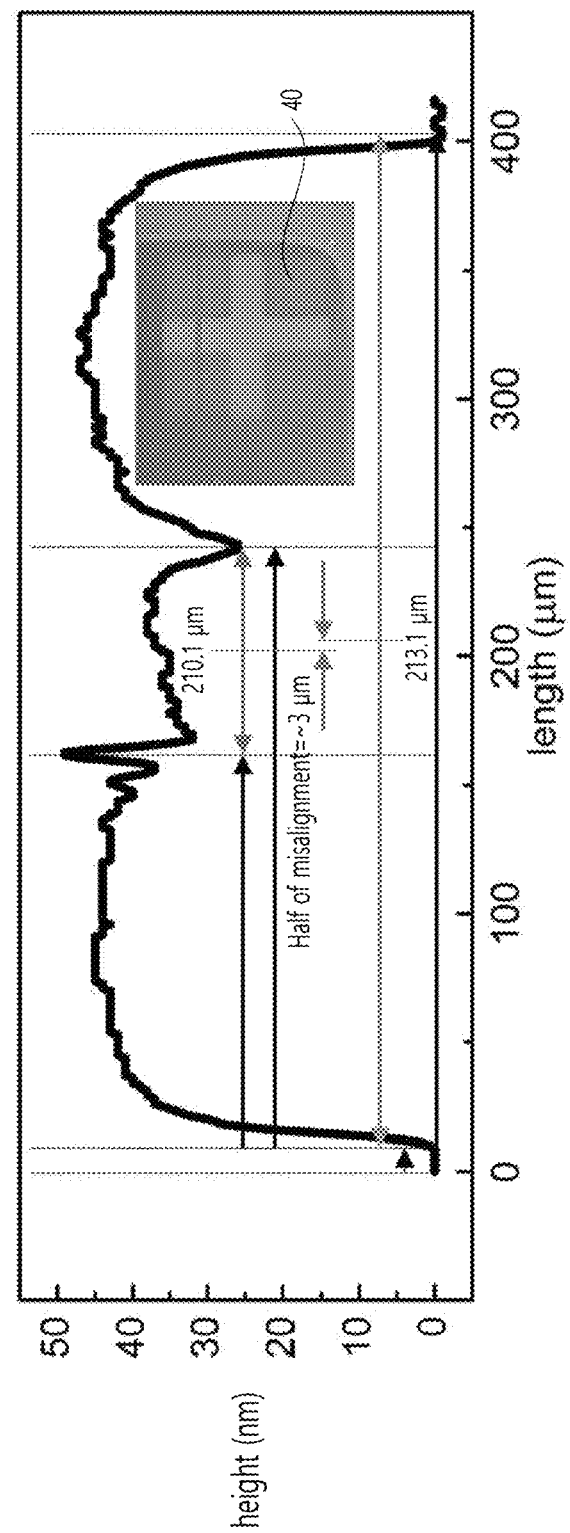
FIGS. 8a and 8b are diagrams illustrating an alignment error of a pattern after performing a multi-layer process according to the second exemplary embodiment of the present disclosure.
Figure 8B:
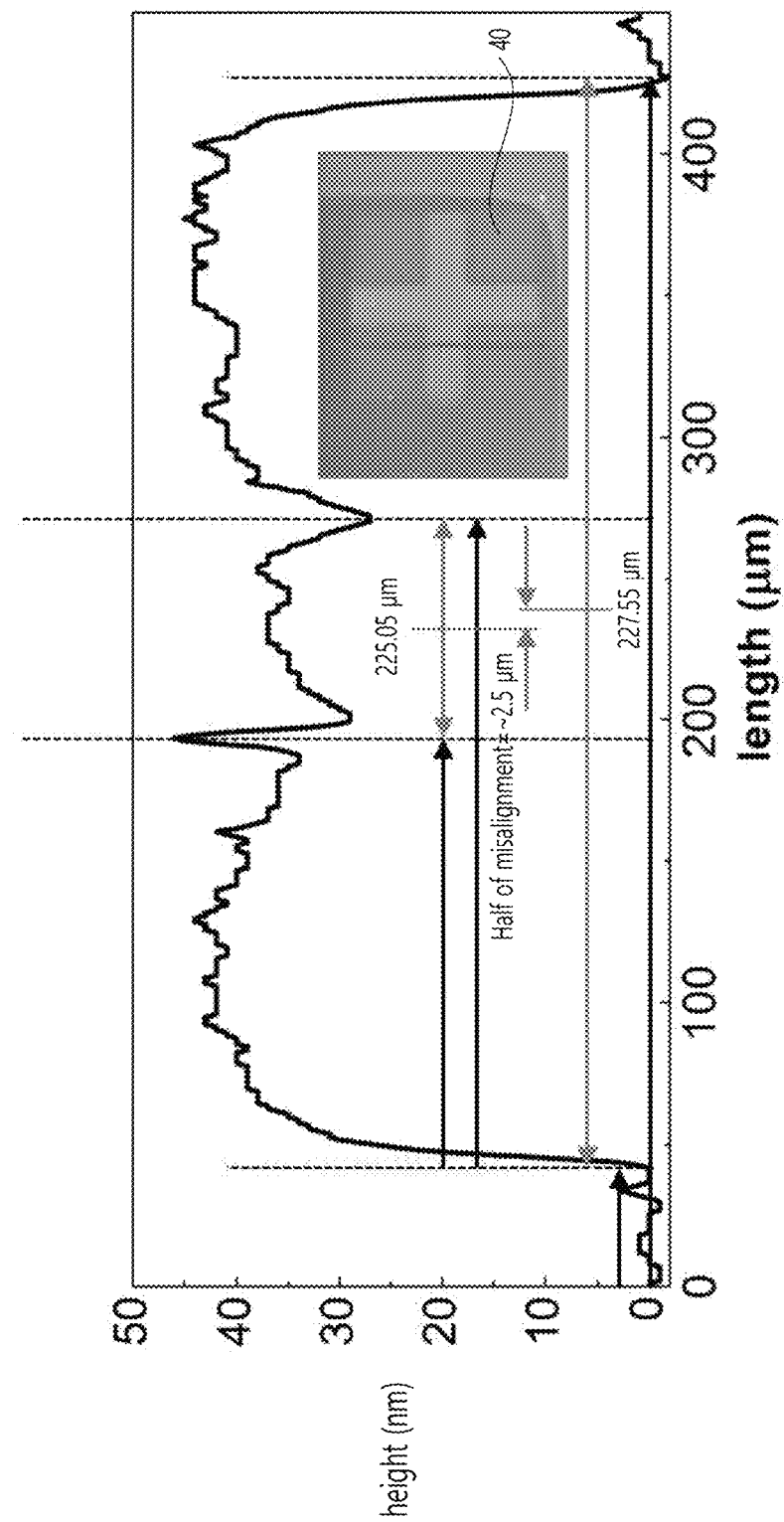

FIGS. 8a and 8b are diagrams illustrating an alignment error of a pattern after performing a multi-layer process according to the second exemplary embodiment of the present disclosure.

Referring to FIG. 8a, a height of a lithography pattern formed upon location alignment of the alignment markers in the first ultrathin film shadow mask 10a and the second ultrathin film shadow mask 10b may be confirmed. As an example, an alignment degree may be determined by confirming a height difference when the positive pattern is formed.

Referring to FIGS. 8a and 8b, when the multi-layer process is conducted, an error of a center between the mark of the first ultrathin film shadow mask 10a and the mark of the second ultrathin film shadow mask 10b in x-axis and y-axis directions may be confirmed as approximately 5 to 6 μm. Accordingly, a sufficient alignment degree may be ensured at the time of application to a micro-unit process (micro fabrication, etc.) according to the second exemplary embodiment of the present disclosure.

Figure 9:
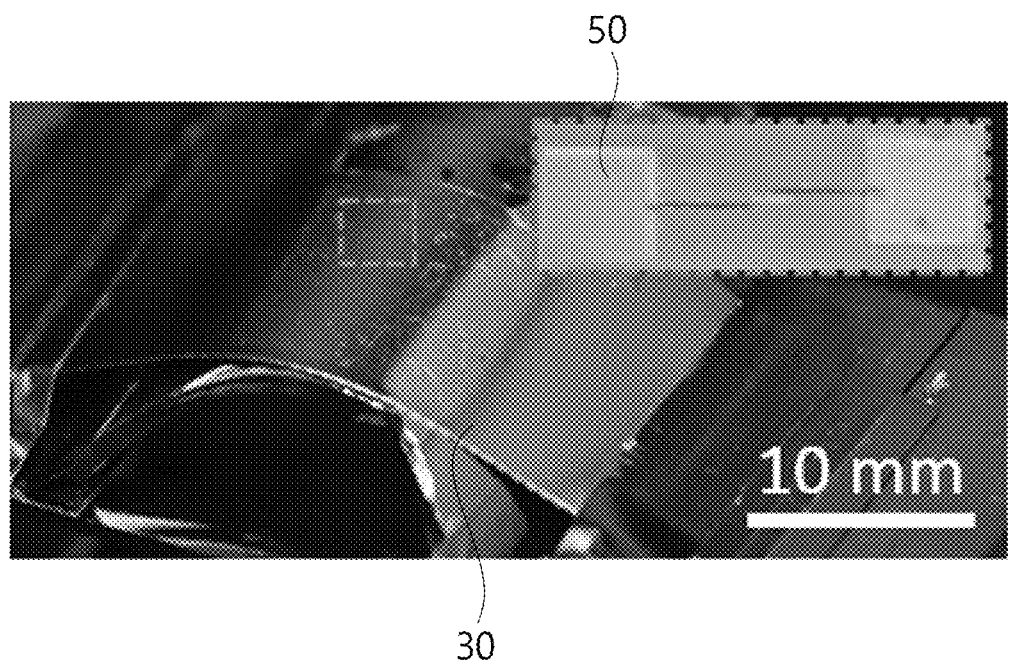
FIG. 9 is a diagram illustrating a transistor formed on a substrate on a curved surface according to the second exemplary embodiment of the present disclosure.

FIG. 9 is a diagram illustrating a multi-layer pattern generated according to the second exemplary embodiment of the present disclosure.

Referring to FIG. 9, the ultrathin film shadow mask according to the present disclosure has the flexible feature as described above. Accordingly, the ultrathin film shadow mask may be used to form an organic transistor on a 3-dimensional shaped substrate illustrated in FIG. 9, e.g., a substrate configured in a curved shape. The ultrathin film shadow mask according to the present disclosure is not limited to the shape illustrated in FIG. 8a, but is applicable to a receiving substrate configured in various shapes and by various curved surfaces.

Hereinafter, a lithography method according to a third exemplary embodiment of the present disclosure will be described with reference to FIGS. 10 to 12. In the third exemplary embodiment, a cleaning process for repeated use of the ultrathin film shadow mask may be additionally performed.

Figure 10:
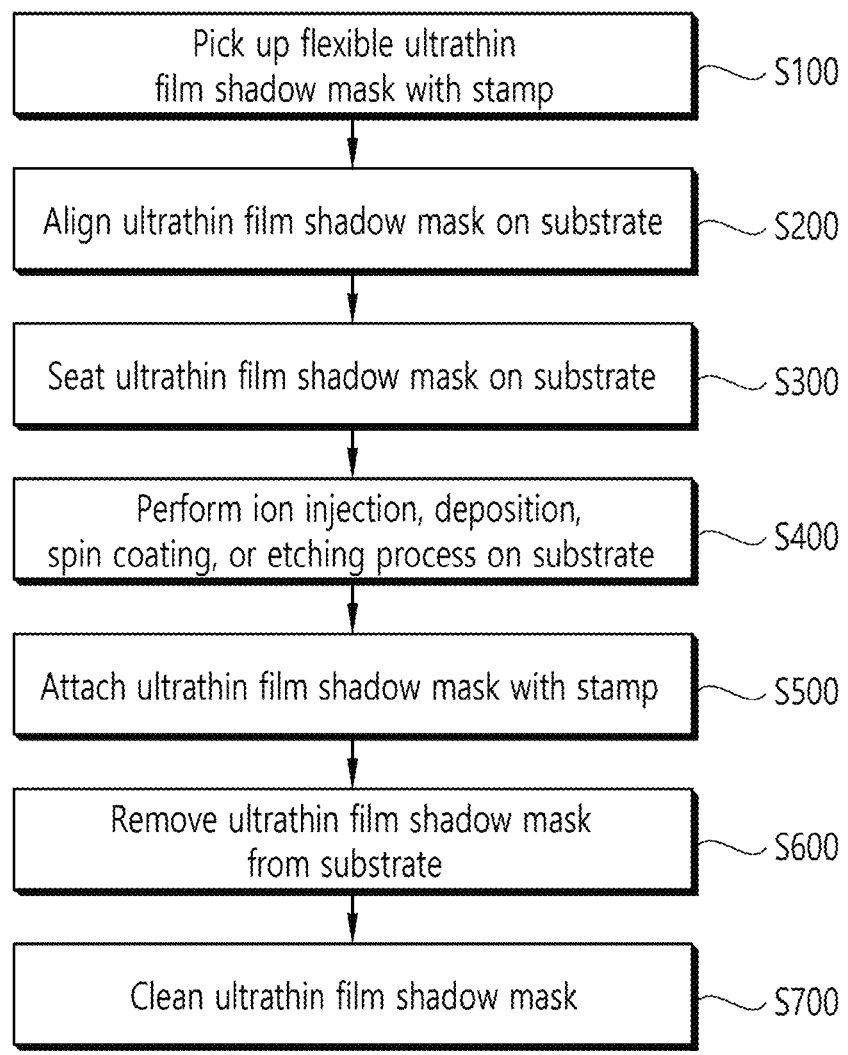
FIG. 10 is a flowchart of a lithography method according to a third exemplary embodiment of the present disclosure.

FIG. 10 is a flowchart of a lithography method according to a third exemplary embodiment of the present disclosure.

Referring to FIG. 10, the third exemplary embodiment includes all steps performed in the second exemplary embodiment to perform the lithography method. The third exemplary embodiment may include the cleaning step S700 performed when the ultrathin film shadow mask is repeatedly used, for example, when the deposition process is repeatedly performed, so the shadow mask is bent and cannot thus show an original function.

Figure 11:
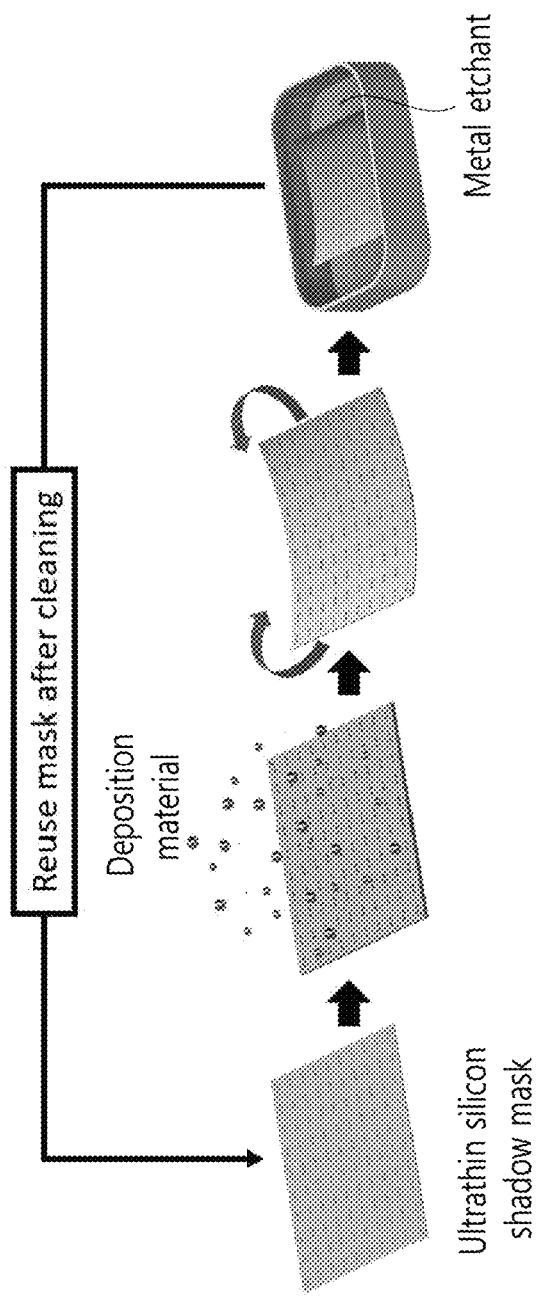
FIG. 11 is a conceptual view illustrating a cleaning step in the third exemplary embodiment of the present disclosure.

FIG. 11 is a conceptual view illustrating a cleaning step in the third exemplary embodiment of the present disclosure.

Referring to FIG. 11, materials may be deposited on the surface when the deposition process is repeatedly performed in the ultrathin film shadow mask. The mask may be bent due to internal stress of the deposited material. The cleaning step corresponds to a step of removing a layer formed on the mask by soaking the ultrathin film shadow mask in an etching solution. The ultrathin film shadow mask is based on the silicon, so etching resistance is strong unlike the polymer based mask. Accordingly, the materials deposited on the ultrathin film shadow mask may be removed through the cleaning step S700, and the ultrathin film shadow mask is recovered to an original shape, and is reusable again.

Figure 12:
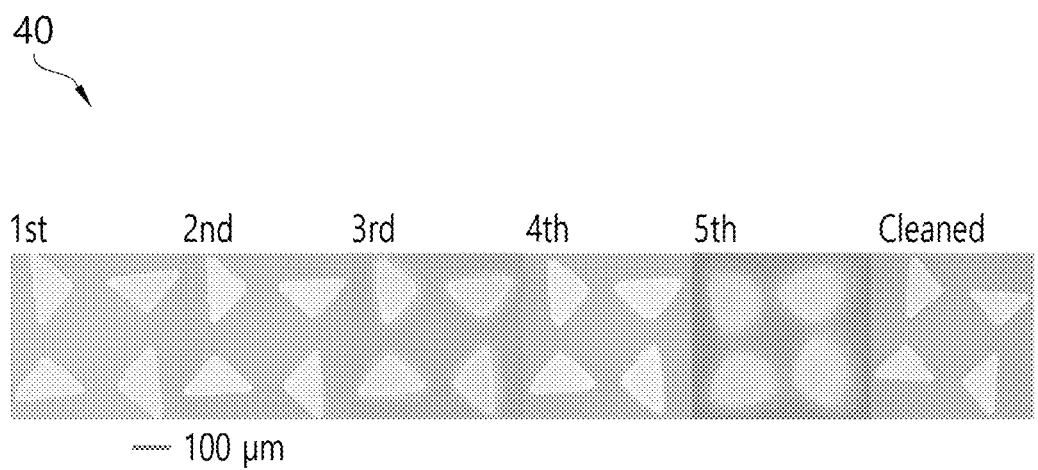
FIG. 12 is a conceptual view illustrating a lithography pattern according to repeated use of a shadow mask and a lithography pattern after cleaning according to the present disclosure.

FIG. 12 is a conceptual view illustrating a lithography pattern according to repeated use of a shadow mask and a lithography pattern after cleaning according to the present disclosure.

Referring to FIG. 12, materials (contaminants) are deposited in the pattern part according to repeated use when performing the deposition process by using the ultrathin film shadow mask. Accordingly, as the number of uses increases (once to five times), accuracy of the lithography pattern is lowered. Thereafter, when the recovered ultrathin film shadow mask is used after performing the cleaning step S700, the resolution and the accuracy of the lithography pattern may be enhanced.

As described above, in the ultrathin film shadow mask for lithography and the lithography method using the same according to the present disclosure, the lithography may be performed by using the mask having the flexible feature and the feature of the etching resistance. According to the present disclosure, it is possible to repeatedly use the shadow mask, the resolution of the lithography pattern may be increased, and it is possible to generate the lithography pattern in the curved surface.

What is claimed is:

1. A lithography method using an ultrathin film shadow mask, comprising:
    picking up a flexible ultrathin film shadow mask with a stamp;
    aligning the ultrathin film shadow mask on a substrate;
    seating the ultrathin film shadow mask on the substrate;
    separating the stamp from the ultrathin film shadow mask;
    performing an ion injection, deposition, spin coating, or etching process on the substrate;
    attaching the ultrathin film shadow mask with the stamp; and
    removing the ultrathin film shadow mask from the substrate.

2. The lithography method using an ultrathin film shadow mask of claim 1, wherein a thickness of the ultrathin film shadow mask is several µm to dozens of µm, and
    when the substrate is bent, the ultrathin film shadow mask is seated in a state of being bent along the substrate.

3. The lithography method using an ultrathin film shadow mask of claim 2, wherein the ultrathin film shadow mask is made of a silicon.

4. The lithography method using an ultrathin film shadow mask of claim 3, wherein in the seating, the ultrathin film shadow mask is fixed to the substrate as a freestanding type.

5. The lithography method using an ultrathin film shadow mask of claim 4, wherein the picking up is configured to pick up the ultrathin film shadow mask by attaching the top of the ultrathin film shadow mask with the stamp.

6. The lithography method using an ultrathin film shadow mask of claim 4, wherein multi-layer patterns are enabled to be formed in the substrate by performing,
    after the removing of the ultrathin film shadow mask from the substrate,
    picking up a second ultrathin film shadow mask having a different pattern from the ultrathin film shadow mask with the stamp,
    aligning the second ultrathin film shadow mask on the substrate,
    seating the second ultrathin film shadow mask on the substrate,
    separating the stamp from the second ultrathin film shadow mask,
    performing an ion injection, deposition, spin coating, or etching process on the substrate,
    attaching the second ultrathin film shadow mask with the stamp, and
    removing the second ultrathin film shadow mask from the substrate.

7. The lithography method using an ultrathin film shadow mask of claim 1, further comprising:
    cleaning the ultrathin film shadow mask removed from the substrate by soaking the ultrathin film shadow mask in an etching solution.

* * * * *